United States Patent [19]

Cooper et al.

[11] 4,423,920

[45] Jan. 3, 1984

[54] ELECTRICAL CONNECTING DEVICE

[75] Inventors: Dale E. Cooper; Ronald E. Grillot; Gary K. Quick; Kevin R. Smith, all of Johnson County, Kans.

[73] Assignee: King Radio Corporation, Olathe, Kans.

[21] Appl. No.: 443,944

[22] Filed: Nov. 23, 1982

Related U.S. Application Data

[63] Continuation of Ser. No. 180,657, Aug. 25, 1980, abandoned.

[51] Int. Cl.³ .............................................. H01R 23/68
[52] U.S. Cl. .......................... 339/252 R; 339/17 LM; 339/17 M
[58] Field of Search ............. 339/17 R, 17 C, 17 CF, 339/17 LM, 17 M, 220 R, 221 R, 252 R; 361/400, 413; 313/51

[56] References Cited

U.S. PATENT DOCUMENTS

| 3,393,396 | 7/1968 | Majewski | 339/252 R |
| 3,922,051 | 11/1975 | Reynolds | 361/413 |
| 4,025,162 | 5/1977 | Yagi | 350/334 |
| 4,132,984 | 1/1979 | Gross | 350/336 |
| 4,257,668 | 3/1981 | Ellis, Jr. | 339/275 B |

Primary Examiner—John McQuade
Attorney, Agent, or Firm—Kokjer, Kircher, Bradley, Wharton, Bowman & Johnson

[57] ABSTRACT

A connecting device for use in a visual display unit to electrically connect a pair of substrates with one another and with a printed circuit board. The device includes a body portion for insertion into a socket or hole of the printed circuit board, a transverse bar providing a seating surface for engaging the board, and a pair of contact elements which are urged by spring action against conductive strips on the substrates.

3 Claims, 3 Drawing Figures

ELECTRICAL CONNECTING DEVICE

This is a continuation of application Ser. No. 180,657, filed Aug. 25, 1980, now abandoned.

BACKGROUND AND SUMMARY OF THE INVENTION

This invention relates in general to electrical connections and deals more particularly with a device which is used to make electrical connections between insulating substrates and between the substrates and printed circuit boards or other connectors.

Display panels for avionic and marine applications frequently employ gas discharge displays and liquid crystal displays. Typically, display units of this type are plugged into sockets of PC boards or other connectors, or they are soldered directly to the PC boards. In either case, the display unit fits within an instrument panel which encloses the circuitry and the pins associated with the display. To properly position the front or display surface of the unit on the instrument panel, it is necessary that the display surface be accurately located relative to the PC board.

This type of display unit includes a pair of insulating substrates having conductors which must be electrically connected with one another and with the PC board. Conventionally, the required connections are effected with epoxy, individual and separate connection elements, and various forms of clips and contacts. The substrate to substrate connections generally utilize either conductive epoxy or clips. The connections of the substrates or substrate assemblies to the PC boards have involved separate connectors and specially constructed clips. The substrate assembly is either plugged into a special connector or has attached to it a special clip or pin which is to be soldered into the PC board or plugged into a connector strip. As can easily be appreciated, these conventional connection techniques require specialized components which are costly to manufacture and difficult to install. Furthermore, the connection device that have been used in the past sometimes fail to make proper electrical contact. The overall result is excessive cost, undue complexity and lack of reliability of the display unit or other device in which the substrate assembly is incorporated.

It is an important object of the present invention to provide, in a gas discharge display or the like, a single integral connecting device which serves to electrically connect a pair of insulating substrates with one another and with a PC board or other connector. The integral construction of the connecting device obviates the need for separate connectors and thus decreases the cost and complexity of the unit and the assembly and installation difficulties associated with separate connection devices.

Another object of the invention is to provide a connection device which maintains electrical contact with the conductors of the substrates and with the PC board in a reliable fashion. Due to the spring construction of the contact elements, the desired electrical contact is continuously maintained even when the unit is subjected to vibration, shock forces, extreme humidity and other adverse conditions tending to disrupt the connection.

Still another object of the invention is to provide a connection device which accommodates variations in the thickness of the substrates and variations in the spacing between the substrates. In the latter respect, the spring construction of the contact elements is again important in that is assures proper electrical contact in substrate assemblies having various substrate spacings.

A further object of the invention is to provide a connection device which accurately locates the substrate assembly in relation to the PC board or connector strip to which the device is attached.

An additional object of the invention is to provide a connecting device wherein the spacing of the substrate assembly from the PC board or connector strip can be easily adjusted.

Yet another object of the invention is to provide a connection device which serves as a self-supporting connection between the substrate assembly and the PC board or other unit to which the substrate assembly is attached.

A still further object of the invention is to provide a connection device of the character described which lends itself to mass production at a low per unit cost.

Other and further objects of the invention, together with the features of novelty appurtenant thereto, will appear in the course of the following description.

DETAILED DESCRIPTION OF THE INVENTION

Figure 1:
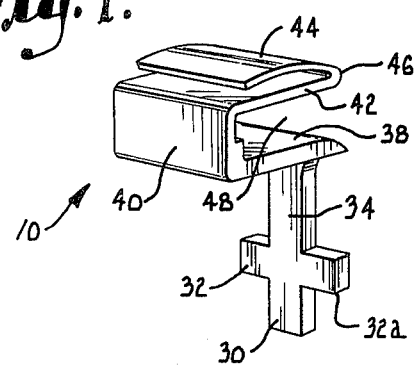
Figure 2:
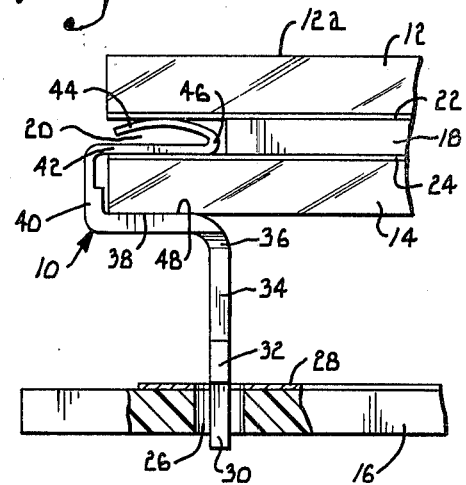
Figure 3:
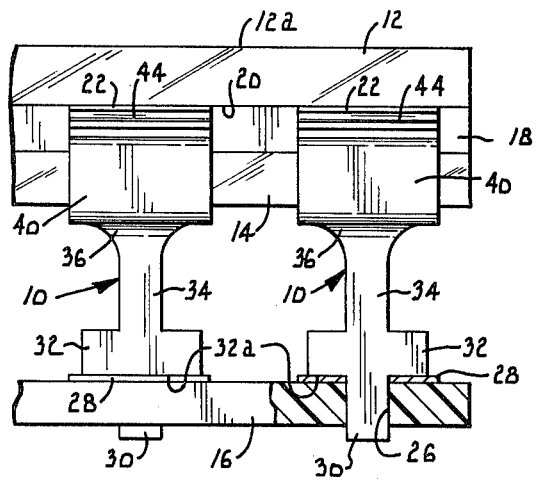

In the accompanying drawings which form a part of the specification and are to be read in conjunction therewith and in which like reference numerals are used to indicate like parts in the various views:

FIG. 1 is a perspective view of an electrical connection device constructed according to a preferred embodiment of the present invention;

FIG. 2 is a side elevational view showing the connection device connecting a substrate assembly with a printed circuit board, with a portion of the board broken away for illustrative purpose and the board and substrate assembly shown fragmentarily; and FIG. 3 is a front elevational view showing a pair of the connection devices connecting the substrate assembly with the printed circuit board, with a portion of the board broken away for illustrative purpose and the substrate assembly and board shown fragmentarily.

Referring now to the drawing in more detail, numeral 10 generally designates an electrical connection device constructed in accordance with the present invention. The connection devices 10 serve to electrically connect a pair of substrates 12 and 14 which are included in a substrate assembly of the type utilized in a liquid crystal display or a gas discharge display (not shown). The upper surface 12a of substrate 12 serves as the display surface. The connection devices serve also to connect the substrate assembly with a printed circuit board 16 or another type of connector such as a connector strip (not shown).

The substrates 12 and 14 of the substrate assembly are small plate-like members constructed of a relatively fragile insulating material. A spacer 18 is connected between the substrates to space them apart a preselected distance. The edge of spacer 18 is recessed inwardly of the free edges of the substrates in order to provide a recess 20 between the edges of the substrates. The free edges of lower substrate 14 and the free edges of upper substrate 12 project outwardly the same distance from the edge of spacer 18. The lower surface of the upper substrate 12 is provided with a plurality of spaced apart electrically conductive strips 22, while the upper surface of the lower substrate 14 is provided with similar electrically conductive strips 24. Spacer 18 is located between conductors 22 and 24, and the outer portions of each pair of conductors are separated by recess 20.

The printed circuit board 16 is constructed conventionally and is provided with a plurality of holes or sockets 26. An electrically conductive strip 28 may be attached to the upper (or lower) surface of the PC board 16 adjacent each of the sockets 26. Alternatively, electrical conductors may be recessed within sockets or holes 26 such that electrical contact is made upon insertion of a conductor into the socket or soldered into the hole.

In accordance with the present invention, each connecting device 10 is formed of an electrically conductive metal to form a single integral piece. A contact body 30 is located on the lower end of each connection device and has a size to fit closely within socket or hole 26 of the PC board. A transverse cross bar 32 is formed at the upper end of body 30 integrally therewith and perpendicular to the body. A flat lower edge of bar 32 provides a seating surface 32a for engagement with the upper surface of the PC board 16 when body 30 is inserted in socket or hole 26. The depth to which contact body 30 can be inserted into socket or hole 26 is limited by engagement of the seating surface 32a with the PC board.

Extending upwardly from bar 32 is a stem portion 34 of the connection device which is co-axial with body 30 and essentially forms an extension thereof. At its upper end, stem 34 is enlarged as indicated at 36, and the enlarged portion has outwardly flared edges of cured configuration, as is best shown in FIG. 3. A flat base plate 38 is formed on top of the flared portion 36. Plate 38 has a flat upper surface for engagement with the underside of the lower substrate 14. Base plate 38 extends at the desired angle to stem 34. A bridge portion 40 of the device extends upwardly from the outer edge of base plate 38. The bridge portion 40 is perpendicular to plate 38 and is long enough to span the free edge of substrate 14 between the lower and upper surfaces thereof.

The means by which electrical contact is made between the substrates includes a pair of contact elements 42 and 44. The lower contact element 42 is in the form of a flat plate which extends inwardly from the top edge of bridge portion 40. Element 42 is generally parallel to base plate 38 and is spaced therefrom a distance slightly greater than the thickness of substrate 14. In its free condition, element 42 has the desired closure to grip lower substrate 14. The upper contact element 44 is in the form of a spring arm which has a curved connection 46 with the inside edge of the lower contact element 42. The upper contact element 44 initially extends gradually upwardly and outwardly away from element 42 and terminates in a free end portion bending back toward element 42, thus providing a relatively large surface contact with the upper conductor 22 of the substrate assembly. The end of element 44 and element 42 has a gap to provide the desired relief to provide ease of insertion. The contact elements 42 and 44 are connected to provide spring action when they are displaced toward one another. When such displacement occurs, the contact elements are resiliently urged away from one another by spring action about the curved connection 46. The base plate 38, bridge portion 40 and lower contact element 42 cooperate to present an open throat 48 of the connection device which closely receives the edge of substrate 14, as will be more fully described.

In use, the connection devices 10 serve to electrically and physically connect the substrate assembly with the PC board 16. Each device 10 is initially applied to the substrate assembly by inserting the contact elements 42 and 44 at the proper location into the recessed space 20 presented between the upper and lower substrates 12 and 14. Insertion of contact elements 42 and 44 between the substrates compresses the contact elements in a manner to displace them toward one another such that they are continuously urged apart by spring action against the appropriate lower and upper conductors 24 and 22. The spring action provided by the contact elements maintains the proper electrical contact at all times, even when the unit is subjected to vibration, shock forces, sever humidity and other adverse conditions tending to disrupt the electrical connections. As shown in FIG. 2, when the connecting device is applied to the substrate assembly, base plate 38 is engaged against the underside of the lower substrate 14, and the bridge portion 40 spans the outer edge thereof. The upper contact element 44 is firmly maintained against conductor 22, while element 42 is firmly maintained in contact with conductor 24. The edge of substrate 14 is closely received within the throat 48.

After each connection device has been applied to the substrate assembly in the manner indicated, its base plate 38 is bonded to the bottom surface of the lower substrate 14. The spring force applied by contact elements 42 and 44, in cooperation with the pressure exerted against the lower substrate by bridge portion 40 with base plate 38, provides a gripping action which holds the connection device in position prior to and during bonding of base plate 38 to the lower substrate. A selected number of connection devices are bonded to the substrate assembly in this fashion, with the connection devices extending in rows along one or more edges of the substrate assembly.

The contact bodies 30 of the connection devices are then plugged into the corresponding sockets or holes 26 of the PC board. When each contact body 30 has been fully inserted, the bottom edge 32a of bar 32 contacts the upper surface of the PC board to establish the spacing of the upper display surface 12a of substrate 12 from the PC board. The contact of bar 32 and body 30 with the conductive strip 28 establishes electrical connection of each connection device with the PC board, while the contact of element 42 with conductor 24 and element 44 with conductor 22 establishes electrical connection of the device with the substrates. In addition, the connection device provides a self-supporting physical connection of the substrate assembly with the PC board and assures proper spacing of the display surface 12a from the PC board.

It should be pointed out that the contact body 30 can be partially inserted into socket or hole 26 in order to space surface 12a more distantly from the PC board. In addition, the stem portion 34 of the connection device can be cut or otherwise severed or broken at a location immediately above bar 32. The stem 34 can then be inserted into socket 26 either partially or fully until the enlarged portion 36 engages the upper surface of the PC board. In this case, the display surface 12a is spaced more closely to the PC board to accommodate situations where less space is available within the instrument panel. The enlarged top portion 36 of the stem thus provides an alternative seating surface for the connection device.

It is thus evident that the connection device 10 provides a simple and economical means for electrically connecting a pair of substrates with one another and with the socket of a PC board or another type of connector. Although the connecting device is partially useful in connection with liquid crystal displays and gas discharge displays such as those used in marine and avionic display units, it is also useful in other types of applications requiring connection of a substrate assembly to a connector such as a PC board.

From the foregoing, it will be seen that this invention is one well adapted to attain all the ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus described the invention, we claim:

1. A device for providing electrical and physically supporting connection between a connector having a socket and a substrate assembly including first and second insulating substrate panels having opposed electrically conductive portions spaced apart from one another within a recess formed between free edge portions of the substrate panels, said device comprising:

a stem portion having a contact body adapted for insertion into the socket of the connector to make electrical contact therewith, said stem portion having a seating surface engaging the connector when said contact body is inserted into the socket;

a generally flat base plate connected with said stem portion;

a bridge portion extending from said base plate and having a length to span the free edge portion of the first substrate panel;

a first plate like contact element extending from said bridge portion in a generally parallel relationship with said base plate and spaced therefrom;

a second plate like contact element forming a spring arm extending from said first contact element;

a curved connecting portion integral with said first and second contact elements and connecting said contact elements in a manner to locate said second contact element in a position substantially folded over said first contact element about said connecting portion, said first and second contact elements being urged apart about said connecting portion by compression spring action when said contact elements are compressed toward one another;

said first and second contact elements being insertable into said recess in electrical contact with said conductive portions of the respective first and second substrate panels with said bridge portion spanning the free edge portion of the first panel and said base plate and first contact element gripping the first panel therebetween, said contact elements being compressed when inserted into the recess whereby the contact elements are urged apart against said conductive portion of the panels; and said stem portion, contact body, base plate, bridge portion and contact elements being formed of an electrically conductive material to establish electrical connection between the conductive portions of the panels and between each conductive portion and said connector and to physically support the substrate assembly from the connector when said contact elements are inserted into the recess and said contact body is inserted into the socket.

2. A device as set forth in claim 1, including a second seating surface on said stem portion spaced from the first mentioned seating surface, said stem portion being frangible between the first and second seating surfaces to break the first seating surface away from the stem portion, whereby the stem portion can then be inserted into the socket until the second seating surface engages the connector to vary the spacing between the substrate assembly and connector.

3. A device as set forth in claim 1, including opposite side edges of said first and second contact elements and said connecting portion forming continuous, uninterrupted extensions of one another.

* * * * *